(12) United States Patent
Kapusta

(10) Patent No.: US 11,804,836 B1
(45) Date of Patent: Oct. 31, 2023

(54) BOOTSTRAPPED SWITCH WITH FAST TURN OFF

(71) Applicant: Analog Devices, Inc., Wilmington, MA (US)

(72) Inventor: Ronald A. Kapusta, Carlisle, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/664,270

(22) Filed: May 20, 2022

(51) Int. Cl.
| | |
|---|---|
| *H03K 3/017* | (2006.01) |
| *H03K 17/041* | (2006.01) |
| *H03K 17/687* | (2006.01) |
| *H02M 1/08* | (2006.01) |
| *H03M 1/12* | (2006.01) |
| *H03M 1/46* | (2006.01) |

(52) U.S. Cl.
CPC ........ *H03K 17/687* (2013.01); *H03M 1/1245* (2013.01); *H03M 1/46* (2013.01)

(58) Field of Classification Search
None
See application file for complete search history.

(56) References Cited

U.S. PATENT DOCUMENTS

| | | | |
|---|---|---|---|
| 3,448,293 A | 6/1969 | Russell | |
| 5,736,887 A | 4/1998 | Spence | |
| 5,945,872 A | 8/1999 | Robertson et al. | |
| 6,020,779 A | 2/2000 | Udo | |
| 6,060,937 A * | 5/2000 | Singer | H03K 17/063 |
| | | | 327/390 |
| 6,118,326 A | 9/2000 | Singer et al. | |
| 6,693,479 B1 | 2/2004 | Bardsley | |
| 7,158,359 B2 | 1/2007 | Bertele et al. | |
| 7,183,814 B2 * | 2/2007 | Kudo | H03K 17/063 |
| | | | 327/91 |
| 7,253,675 B2 * | 8/2007 | Aksin | G11C 27/024 |
| | | | 327/390 |
| 7,397,284 B1 * | 7/2008 | Liu | H03K 19/018528 |
| | | | 326/88 |
| 8,212,536 B2 | 7/2012 | Burns et al. | |
| 8,664,979 B2 * | 3/2014 | Doris | G11C 27/024 |
| | | | 327/390 |
| 8,810,283 B2 | 8/2014 | Hensley et al. | |
| 9,444,483 B2 | 9/2016 | Okamoto | |
| 9,461,463 B2 | 10/2016 | Briere et al. | |
| 9,584,112 B2 * | 2/2017 | Tang | H03K 17/063 |
| 9,641,166 B2 * | 5/2017 | Devarajan | G11C 27/02 |
| 9,979,183 B2 | 5/2018 | Tornila Oliver et al. | |
| 10,250,250 B2 | 4/2019 | Devarajan et al. | |
| 10,295,572 B1 * | 5/2019 | Mai | G01R 15/16 |
| 10,355,686 B2 | 7/2019 | Tang et al. | |

(Continued)

*Primary Examiner* — Kenneth B Wells
(74) *Attorney, Agent, or Firm* — Schwegman Lundberg & Woessner, P.A.

(57) ABSTRACT

The present disclosure provides designs and techniques to improve turn "off" times of a bootstrapped switch, maximizing the total "on" time of the bootstrapped switch. The techniques described herein provide a protection device coupled to the bootstrapped switch. The protection device may be controlled by an input voltage to the bootstrapped switch during a boosting phase and may be controlled by a constant voltage during a non-boosting phase. The techniques for reducing turn "off" times are particularly useful in high-speed applications, such as high-speed, low-voltage analog-to-digital converters.

20 Claims, 7 Drawing Sheets

(56) References Cited

U.S. PATENT DOCUMENTS

| | | |
|---|---|---|
| 10,547,308 B2 | 1/2020 | Shen |
| 10,897,263 B1 * | 1/2021 | Mastantuono ....... G11C 27/024 |
| 11,070,207 B2 * | 7/2021 | Huang ............. H03K 19/01735 |
| 11,152,931 B2 * | 10/2021 | Singer ............ H03K 19/018521 |
| 11,184,002 B2 * | 11/2021 | Bora .................... H03K 17/687 |
| 11,190,178 B1 | 11/2021 | Collins et al. |
| 2002/0159276 A1 * | 10/2002 | Deboy .............. H02M 3/33507 363/20 |

* cited by examiner

BOOTSTRAPPED SWITCH WITH FAST TURN OFF

TECHNICAL FIELD

The present disclosure generally relates to bootstrapped switch circuits, in particular to reducing turn off times of bootstrapped switches.

BACKGROUND

Bootstrapping refers to pulling up the operating point of a switching transistor above the power supply rail voltage. Typically, in an "off" state, the gate of the bootstrapped switch is connected to a fixed voltage, such as ground, and, in an "on" state, a constant voltage is applied across the gate-to-source terminals. That is, the gate voltage can track the input voltage shifted by some voltage, keeping the gate-to-source voltage constant regardless of the input signal. Benefits of the constant gate-to-source voltage are that the switch resistance is independent of the input signal, and much of the switch parasitic capacitances, such as the $C_{gs}$ and $C_{gd}$, do not load the input.

One drawback of bootstrapped switches can be the lag in turning them off. Because of the voltage at the gate is often beyond the supply rails the circuit, bootstrapped switches can take a relatively long time to turn off, thus reducing the total "on" time. Further, the turn off time may be dependent on the input signal, which can lead to signal-dependent errors, such as distortion. This may have detrimental effects, particularly in high-speed applications.

BRIEF DESCRIPTION OF THE DRAWINGS

Various ones of the appended drawings merely illustrate examples of the present disclosure and should not be considered as limiting its scope.

DETAILED DESCRIPTION

The present disclosure provides designs and techniques to improve turn "off" times of a bootstrapped switch. This maximizes the total "on" time of the bootstrapped switch. Also, with a sharper transition from "on" to "off", the present disclosure can provide a switch that can be suitable for sampling high-speed signals with high linearity. The techniques described herein provide a protection device coupled to the bootstrapped switch. The protection device may be controlled by an input voltage to the bootstrapped switch during a boosting phase and may be controlled by a constant voltage during a non-boosting phase. The techniques for reducing turn "off" times are particularly useful in high-speed applications, such as high-speed, low-voltage analog-to-digital converters.

This document describes a circuit to improve turn-off time. The circuit includes a switch coupled to an input node for receiving an input voltage and to an output node and having a control terminal; a generator circuit coupled to the control terminal to control turning on the switch during a boosting phase; and a turn-off circuit coupled to the control terminal to control turning off the switch, the turn-off circuit including a protection device controlled by the input signal during the boosting phase.

This document also describes a method comprising: receiving an input signal; during a boosting phase, boosting the input signal to generate a boosted control signal applied to a switch, wherein the switch is coupled to a turn-off circuit including a protection device; and controlling the protection device by the input signal during the boosting phase.

This document further describes a circuit comprising a switch including: an input terminal to receive an input voltage, an output terminal to connect to an output voltage, and a control terminal to control operation of the switch. The circuit also comprises a generator circuit to generate the control signal to turn on the switch during the boosting phase and a turn-off circuit coupled to the control terminal, the turn-off circuit including a protection device controlled by the input voltage during the boosting phase.

Figure 1:
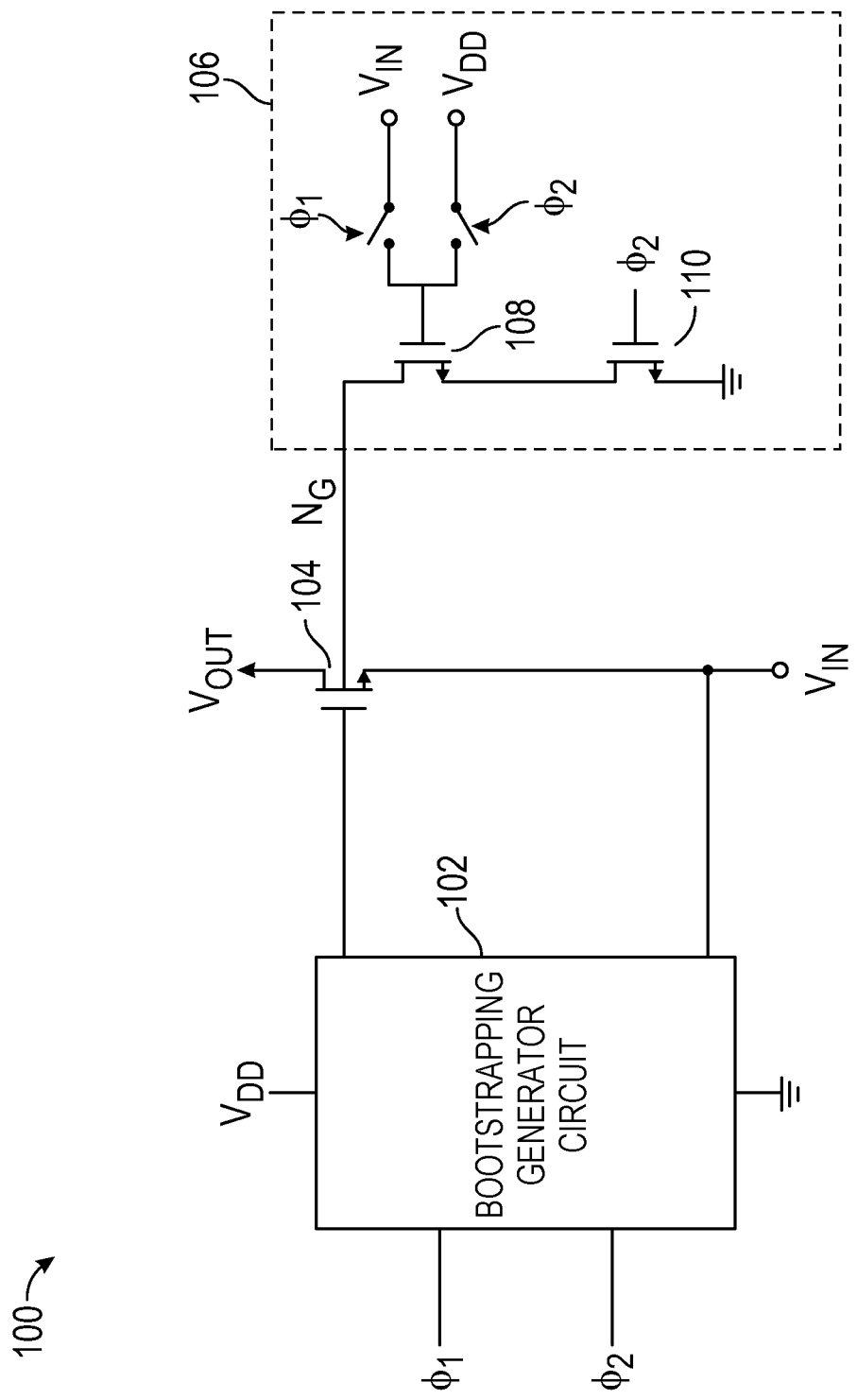
FIG. 1 is a circuit diagram of example portions of a bootstrapping circuit.

FIG. 1 illustrates a circuit diagram of example portions of a bootstrapping circuit 100. The bootstrapping circuit 100 may include a bootstrapping generator circuit 102, a bootstrapped switch 104, and a turn-off circuit 106 with a protection device 108 and a switch 110.

The bootstrapped switch 104 may connect an input node ($V_{IN}$) to an output node ($V_{OUT}$). The bootstrapped switch 104 may be provided as a Metal Oxide Semiconductor (MOS) Field Effect Transistor (FET) switch such as an NMOS or PMOS transistor. For example, the bootstrapped switch 104 may be connected to $V_{IN}$ at its source terminal and to $V_{OUT}$ at its drain terminal. When the bootstrapped switch 104 is "on", $V_{IN}$ would be connected to $V_{OUT}$ with a low impedance and, when "off", the bootstrapped switch 104 would present a high impedance between the two nodes. The gate of the bootstrapped switch 104 may be controlled by the bootstrapping generator circuit 102. The voltage at the gate of bootstrapped switch 104, relative to the voltage at nodes $V_{IN}$ and $V_{OUT}$, controls whether the switch is in the "on" or "off" state.

The bootstrapping generator circuit 102 may receive inputs: $V_{IN}$, power supply voltages (e.g., $V_{DD}$, which may be supplied as $V_{DD+}$, $V_{DD-}$, ground, and/or a combination thereof), and clock phases Φ1, Φ2. The bootstrapping generator circuit 102 may turn "on" the bootstrapped switch 104 via node $N_G$. The power supply voltage(s) may provide a reference for the control at node $N_G$. The power supply voltage(s) may be the same power supplies used in other circuits, or they may be unique references supplied solely to the bootstrapped switch. The on and off intervals of the bootstrapped switch 104 may be defined by clock phases Φ1 and Φ2. For example, the bootstrapped switch 104 may be "on" during a boosting phase when the bootstrapping generator circuit 102 may boost the input voltage $V_{IN}$ by some voltage to generate the boosted gate signal $N_G$ during boosting phase Φ1. Likewise, the bootstrapped switch 104 may be not boosted from the input during non-boosting phase Φ2. The generator circuit 102 may relinquish control of node $N_G$ during non-boosting phase Φ2, so that some other circuit (e.g., turn-off circuit 106) may control $N_G$ and turn the bootstrapped switch 104 "off". In some examples, Φ1 and Φ2 may be derived from the high and low periods of a single clock. In some other examples, Φ1 and Φ2 may be derived from separate clocks, for example, to define specific overlapping or non-overlapping periods between the two phases.

The turn-off circuit 106 may also be coupled to node $N_G$ and control $N_G$ to turn off the bootstrapped switch 104. The turn-off circuit 106 may include the protection device 108 and switch 110. The protection device 108 and the switch 110 may be provided as NMOS or PMOS transistors. For example, the drain of the protection device 108 may be coupled to node $N_G$, and the source of the protection device 108 may be coupled to the drain of switching device 110. The source of the switching device 110 is coupled to a reference potential (e.g., ground), and the switching device 110 may be controlled such that it is turned on during the non-boosting phase Φ2 to couple node $N_G$ to ground through the protection device 108.

In conventional systems, protection devices such as the protection device 108 would typically be controlled by a constant voltage, such as the supply voltage $V_{DD}$. This conventional design leads to slow turn-off times of bootstrapped switches, as described above.

The control of the protection device 108, as described herein, may provide the improved speed of turning off the bootstrapped switch 104. During the boosting phase as defined by Φ1, the protection device 108 may be controlled by the input voltage $V_{IN}$ (as shown by connection of $V_{IN}$ to the gate of the protection device 108). During the non-boosting phase as defined by Φ2, the protection device 108 may be controlled by a constant voltage, such as the power supply $V_{DD}$. Unlike conventional techniques that typically couple devices such as the protection device to only a constant voltage, this variable control of the protection device 108 can increase the speed that bootstrapped switch 104 can turn off.

During the boosting phase Φ1, the voltage at node $N_G$ is the input voltage $V_{IN}$ boosted by some constant gate-to-source voltage, which can be represented as $V_{IN}+V_{DD}$ if the power supply is used as the constant gate-to-source voltage. During the boosting phase Φ1, the gate of the protection device 108 is set to $V_{IN}$. Because switch 110 is "off", the source of protection device 108 will rise to $V_{IN}$ such that the protection device 108 is also "off". The voltage between any two terminals of the protection device 108 and between any two terminals of switch 110 are less than $V_{DD}$, provided that $V_{IN}<V_{DD}$. This maintains each device within its safe operating region.

During the non-boosting-phase Φ2, the gate of protection device 108 is connected to $V_{DD}$, turning it "on". Switch 110 is also turned "on", and the series combination of the protection device 108 and switch 110 will discharge node $N_G$ to ground, turning "off" the bootstrapped switch 104. The instant at which the bootstrapped switch 104 turns "off" is when node $N_G$ is discharged below the voltage at $V_{IN}$, i.e., when the gate-to-source voltage of the bootstrapped switch 104 becomes zero. At this instant, because protection device 108 is "on", node $N_G$ and the drain of switch 110 will be the same voltage and equal to $V_{IN}$. Thus, in the process of turning "off" bootstrapped switch 104, node $N_G$ is discharged from $(V_{DD}+V_{IN})$ to $V_{IN}$, for a voltage change of $V_{DD}$.

Therefore, the turn-off time for bootstrapped switch 104 is improved. The voltage changes at both nodes $N_G$ and the drain of switch 110 are signal independent, minimizing the variation of the turn off time based on variation with the input signal. Moreover, because node at the drain of switch 110 does not need to be discharged at all prior to bootstrapped switch 104 being turned "off", the impact of device and parasitic capacitance is minimized and the turn-off time is reduced. After bootstrapped switch 104 is turned "off", nodes $N_G$ and the drain of switch 110 will continue to be discharged to 0V. However, because the bootstrapped switch 104 remains "off", the speed of this residual discharge is not critical.

The processes of device turn-on and turn-off have been described for zero-threshold-voltage devices, i.e. an NMOS device is "off" if its gate-to-source voltage is equal to or less than zero. For devices with non-zero thresholds, node voltages may need to change more or less before turning devices "on" or "off". However, the techniques described herein still result in minimized overall turn-off time as well as signal independence of turn-off time.

Figure 2A:
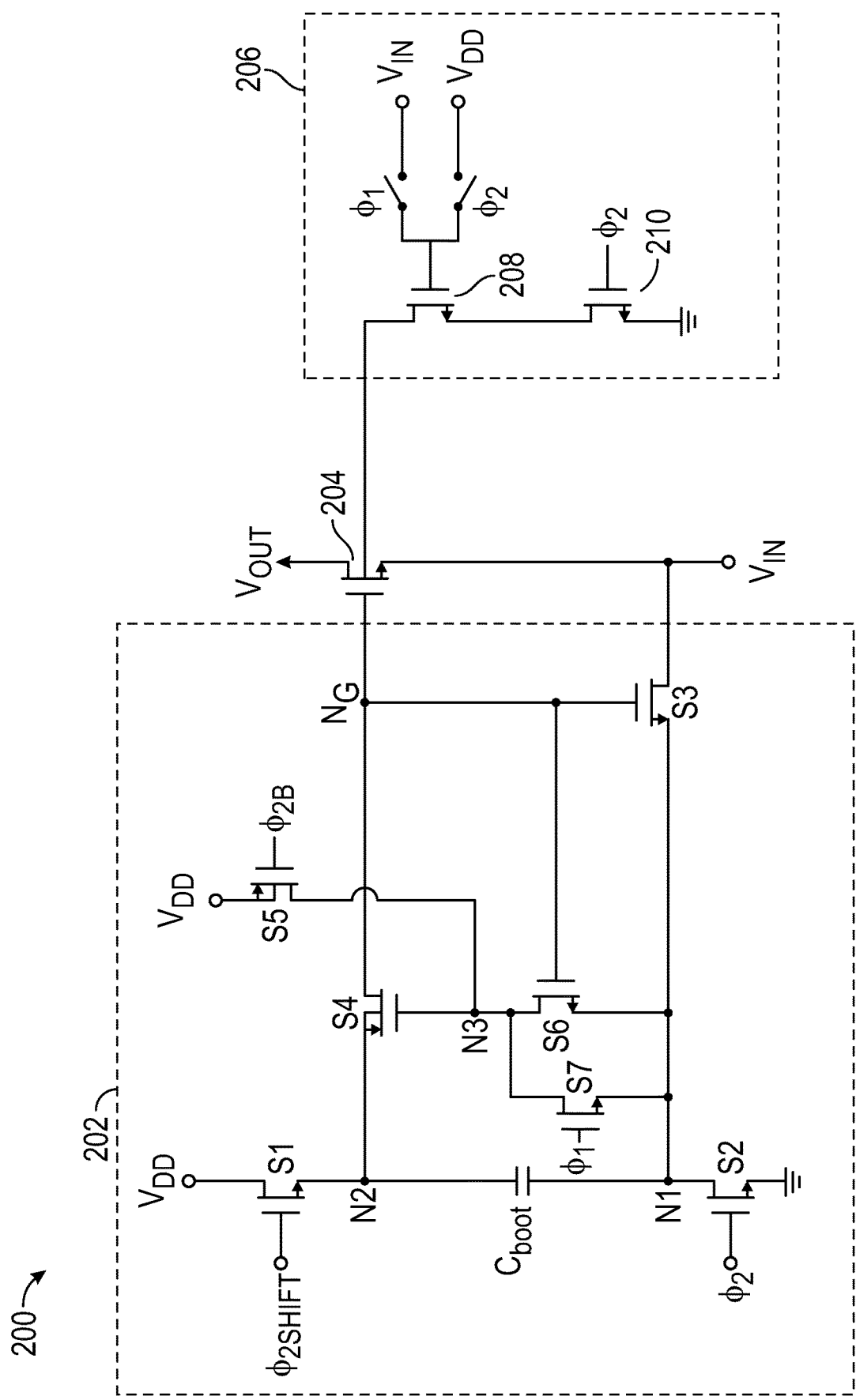
FIG. 2A is a circuit diagram of example portions of a bootstrapping circuit.

The techniques described herein to improve the turn off times of a bootstrapped switch can work with different implementations of bootstrap generator circuits. FIG. 2A illustrates a circuit diagram of example portions of a bootstrapping circuit 200 showing the details of an example bootstrapping generator circuit. The bootstrapping circuit 200 may include a bootstrapping generator circuit 202, a bootstrapped switch 204, and a turn-off circuit 206 with a protection device 208 and a switch 210.

The bootstrapped switch 204 may connect an input node ($V_{IN}$) and to an output node ($V_{OUT}$). The bootstrapped switch 204 may be provided as an NMOS or PMOS transistor. For example, the bootstrapped switch 204 may be connected to $V_{IN}$ at its source terminal and to $V_{OUT}$ at its drain terminal. When the bootstrapped switch 204 is "on", $V_{IN}$ would be connected to $V_{OUT}$ with a low impedance and, when "off", the bootstrapped switch 204 would present a high impedance between the two nodes. The gate of the bootstrapped switch 204 may be controlled by the bootstrapping generator circuit 202. The voltage at the gate of bootstrapped switch 204, relative to the voltage at nodes $V_{IN}$ and $V_{OUT}$, controls whether the switch is in the "on" or "off" state.

The bootstrapping generator circuit 202 may receive inputs: $V_{IN}$, power supply voltages (e.g., $V_{DD}$, which may be supplied as $V_{DD+}$, $V_{DD-}$, ground and/or a combination thereof), and clock phases Φ1, Φ2, Φ1B, Φ2B. Φ1B, Φ2B are the inverses of clock phases Φ1, Φ2, respectively. The power supply voltage(s) may provide a reference for the control at node $N_G$. The power supply voltage(s) may be the same power supplies used in other circuits, or they may be unique references supplied solely to the bootstrapped switch.

The bootstrapping generator circuit 202 may include switches S1-S7 and capacitor $C_{boot}$. During the boosting phase, at node N1, $V_{IN}$ is present via switch S3 and drives the bottom plate of capacitor $C_{boot}$. The sum of the input voltage and supply voltage ($V_{IN}+V_{DD}$) appears at the top plate of capacitor $C_{boot}$. Thus, during the boosting phase, the voltage $V_{IN}+V_{DD}$ is generated at node $N_G$ and turns "on" the bootstrapped switch 204, as described above with reference to FIG. 1.

The turn-off circuit 206 may also be coupled to node $N_G$ and control $N_G$ to turn off the bootstrapped switch 204. The turn-off circuit 206 may include the protection device 208 and switch 210. The protection device 208 and the switch 210 may be provided as NMOS or PMOS transistors. For example, the drain of the protection device 208 may be coupled to node $N_G$, and the source of the protection device 208 may be coupled to the drain of switching device 210. The source of the switching device 210 is coupled to ground, and the switching device 210 may be controlled such that it is turned on during the non-boosting phase Φ2, to couple node $N_G$ to ground through the protection device 208.

The control of the protection device 208, as described herein, may provide the improved speed of turning off the bootstrapped switch 204. As described above, during the boosting phase as defined by Φ1, the protection device 208 may be controlled by the input voltage $V_{IN}$. During the non-boosting phase as defined by Φ2, the protection device 208 may be controlled by a constant voltage, such as the power supply $V_{DD}$. Unlike conventional techniques that typically couple devices such as the protection device to only a constant voltage, this variable control of the protection device 208 can increase the speed that bootstrapped switch 204 can turn off.

Figure 2B:
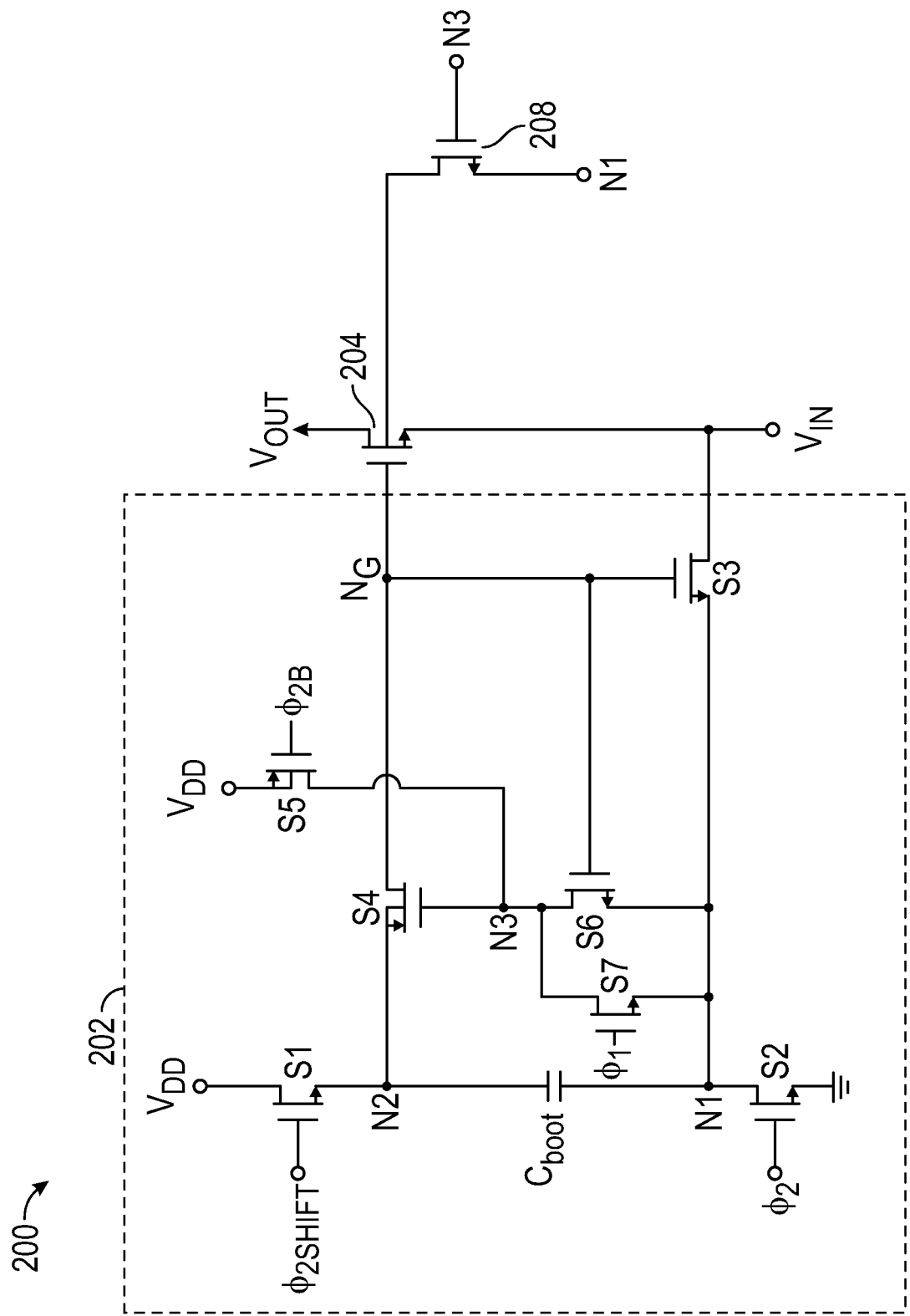
FIG. 2B is a circuit diagram of example portions of a bootstrapping circuit.

In some examples, the turn-off circuit may be able to re-use certain components and connections from the other parts of the bootstrapping circuit 200, such as the bootstrapping generator circuit 202. FIG. 2B illustrates a circuit diagram of example portions of the bootstrapping circuit 200.

Here, the gate of the protection device 208 is coupled to node N3 such that during the boosting phase as defined by Φ1, the gate is effectively coupled to $V_{IN}$ and during the non-boosting phase as defined by Φ2, the gate is effectively coupled to $V_{DD}$. That is because during the boosting phase, the input voltage $V_{IN}$ is present at node N3 via switches S3, S6 and S7. During the non-boosting phase, the power supply voltage $V_{DD}$ is present at node N3 via switch S5. Moreover, the source of the protection device 208 can be coupled to node N1 so that node $N_G$ is coupled to ground through switch S2 during the non-boosting phase as defined by Φ2, eliminating the need for switch 210.

The techniques described herein can improve turn "off" times across different input voltages. For example, when turn-off circuits are controlled by only constant voltages, such as $V_{DD}$, the turn off times can significantly vary depending on the value of the input voltage. Lower input voltages tend to have much longer turn off times in these circuit designs. However, the techniques described herein using variable control of the turn-off circuit using different control voltages during boosting and non-boosting phases can significantly improve turn off times regardless of the values of the input voltage.

Figure 3:
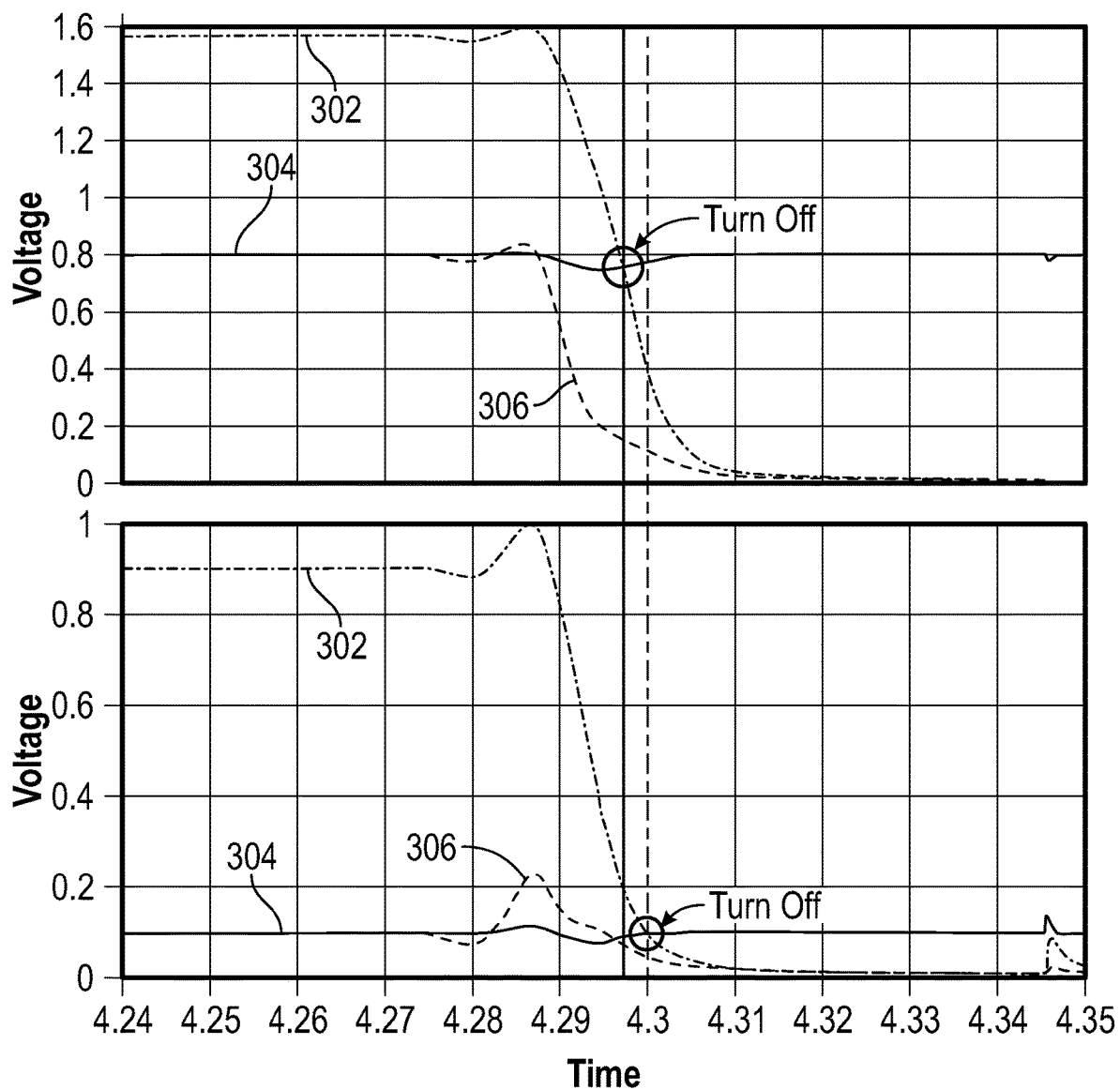
FIG. 3 shows voltage plots of different input voltages of a bootstrapping circuit.

FIG. 3 illustrates voltage plots of different input voltages of the bootstrapping circuit 200. FIG. 3 illustrates voltage on the y-axis and time on the x-axis. FIG. 3 shows the voltage at node $N_G$, 302, input voltage $V_{IN}$, 304, and the voltage at node N1, 306. In the top plot, the input voltage $V_{IN}$ is higher and closer to VDD at ~0.8 V than the bottom plot where the input voltage $V_{IN}$ is at ~0.1 V. The bootstrapped switch 204 turns off at the intersection of the $V(N_G)$ 302 and $V_{IN}$ 304. As illustrated, the turn off times between the two different input voltages is substantially close when compared to the rate of change of the node voltages.

Figure 4:
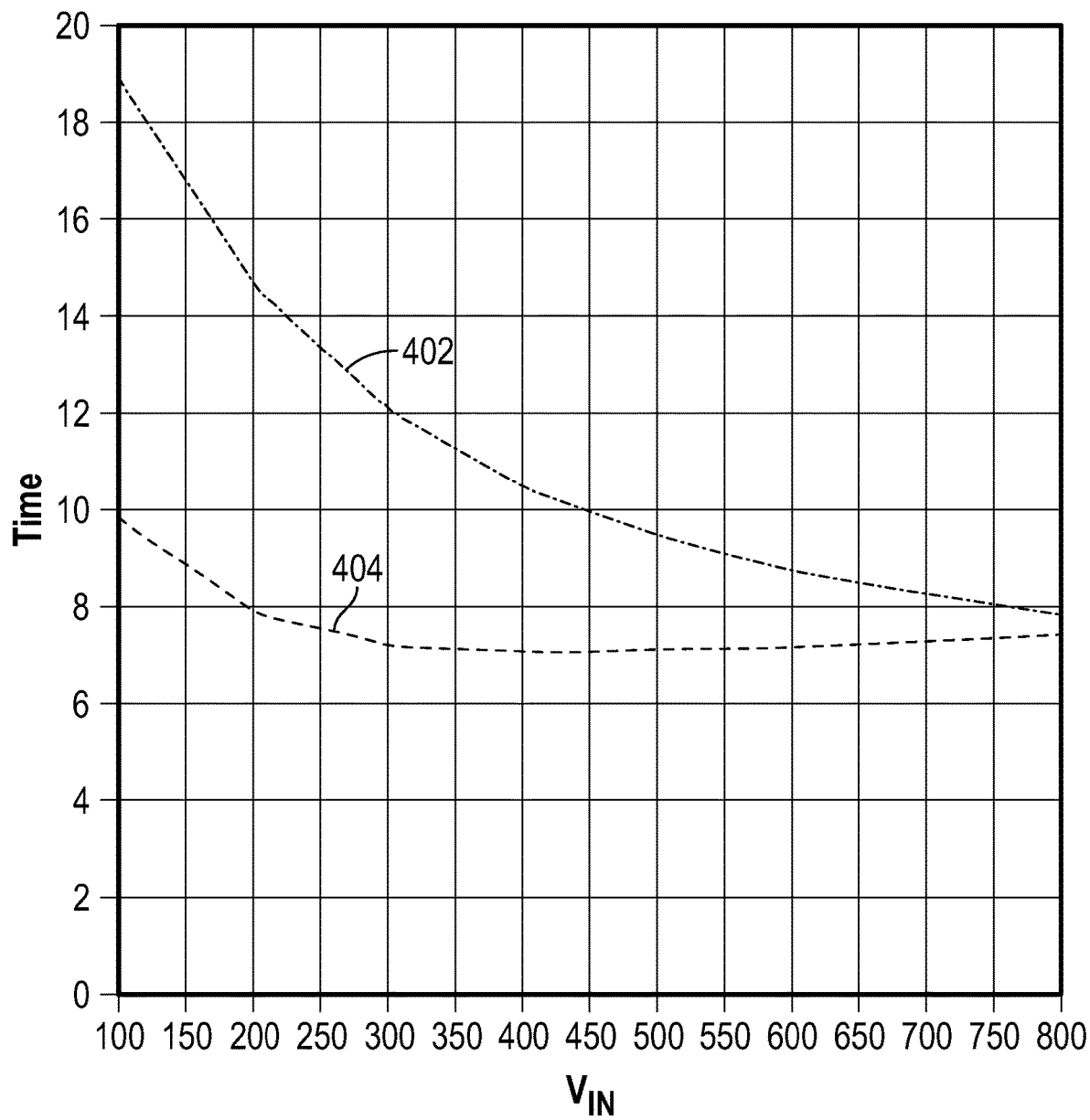
FIG. 4 shows a plot of turn off times for bootstrapped switch versus input voltage.

This improved transitioning of turn off times is further illustrated in FIG. 4, which shows a plot of turn off times for bootstrapped switch on the y-axis, versus input voltage ($V_{IN}$) on the x-axis. The curve 402 shows the turn off times for conventional circuits where the turn-off circuit is controlled only by a constant voltage such as $V_{DD}$. Here, as illustrated for low $V_{IN}$ values (~0.1 V), the turn off time is about 19 ps and for high $V_{IN}$ values (~0.8V) is about 8 ps. Thus, there can be a difference of about 2.4×depending on the $V_{IN}$ values. The curve 404 shows the turn off times for the bootstrapped switch using the variable control technique for the turn-off circuit, as described herein. Here, the bootstrapped switch turns off faster in all cases and varies about 6× less as a function of the input signal.

The techniques described herein can be used in complementary bootstrapped switch circuits. Complementary bootstrapped switch circuits may use, for example, NMOS transistors with controls boosted above $V_{DD}$ and may use PMOS transistors with controls boosted below ground. Complementary switches can enable faster turn on properties.

Figure 5:
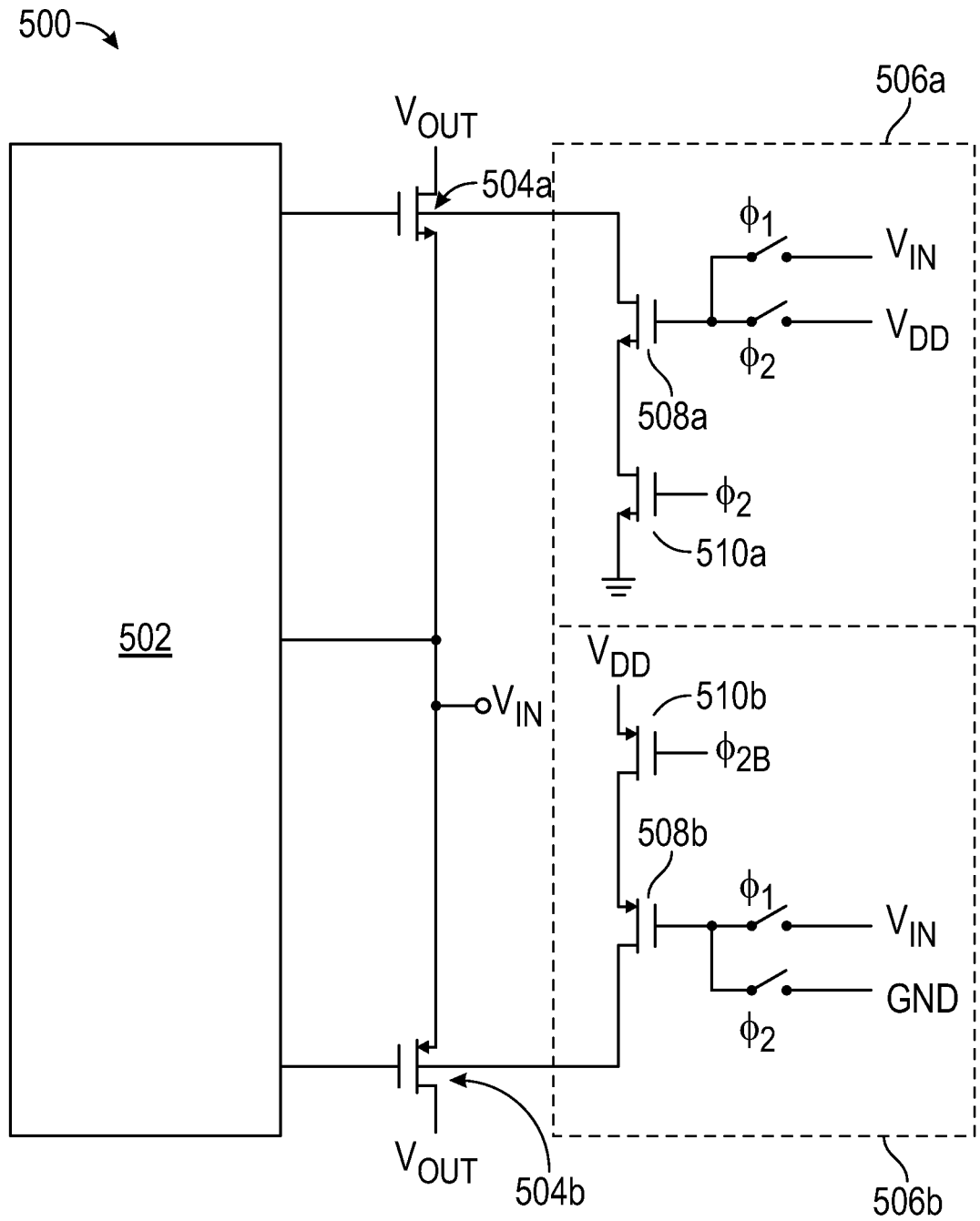
FIG. 5 is a circuit diagram of example portions of a complementary bootstrapping circuit.

FIG. 5 illustrates a circuit diagram of example portions of a circuit 500 with complementary bootstrapped switch circuits. Circuit 500 may include a bootstrapping generator circuit 502. Circuit 500 may also include complementary bootstrapped switches 504a, 504b with corresponding turn-off circuits 506a, 506b. In this example, bootstrapped switch 504a is provided as an NMOS transistor. The operation of bootstrapped switch 504a and turn-off circuit 506a with protection device 508a and switch 510a is substantially the same as the corresponding elements in the bootstrapping circuit 100 described above with reference to FIG. 1.

The bootstrapped switch 504b is provided as a PMOS transistor, as are protection device 508b and switch 510b. Operation of the complementary bootstrap switch 504b and turn-off circuit 506b is substantially the same as the corresponding elements in the bootstrapping circuit 100 described above with reference to FIG. 1 with the exception that switch 510b is controlled by Φ2B and is coupled to $V_{DD}$ instead of ground, and the protection device 508b is controlled by ground during the non-boosting phase.

Figure 6:
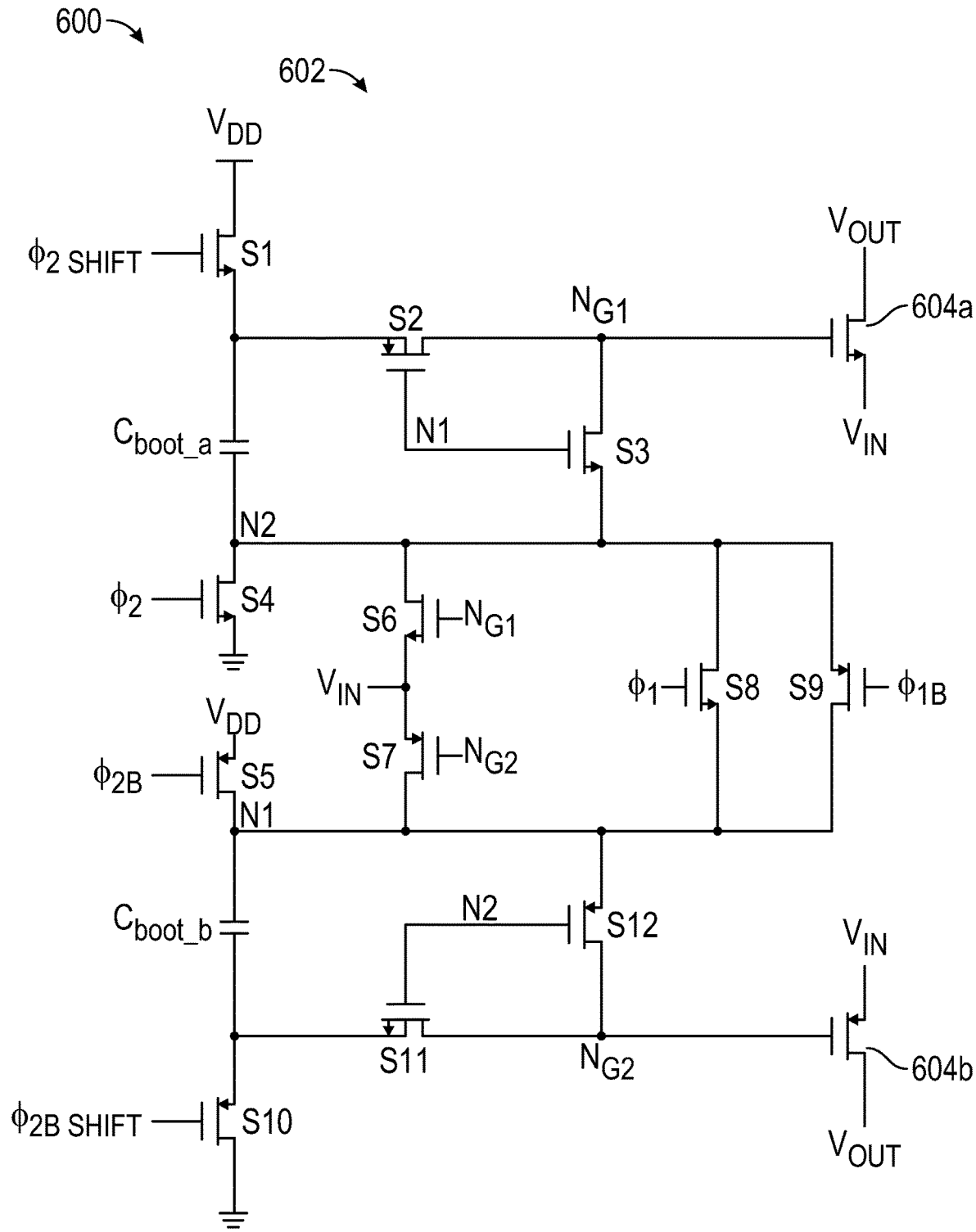
FIG. 6 is a circuit diagram of example portions of a bootstrapping circuit.

FIG. 6 illustrates example portions of a bootstrapped circuit 600 with complementary bootstrapped switch circuits. Circuit 600 may be a complementary version of circuit 200 shown in FIG. 2B where the gates of the bootstrapped switches 604a, 606b are coupled to other portions of the bootstrapped circuit 600 (which includes switches S1-S12 and capacitors $C_{boot\_a}$, $C_{boot\_b}$) such that during the boosting phase as defined by Φ1, the gate of bootstrapped switch 604a ($N_{G1}$) is effectively coupled to $V_{IN}$ through boost capacitor $C_{boot}$, and, during the non-boosting phase as defined by Φ2, the gate is effectively coupled to ground. Also, during the boosting phase as defined by Φ1, the gate of bootstrapped switch 604b ($N_{G2}$) is effectively coupled to $V_{IN}$ through boost capacitor $C_{boot\_b}$, and, during the non-boosting phase as defined by Φ2, the gate is effectively coupled to $V_{DD}$.

Moreover, the techniques described can be used in bootstrapping circuits and clock-boosting circuits. In bootstrapping circuits, the input voltage is boosted by a fixed voltage (e.g., $V_{DD}$) in order to drive a bootstrapped switch, whereas the input voltage is a variable voltage. In clock-booster circuits, the output voltage is boosted to a fixed voltage, typically greater than $V_{DD}$ or lower than ground, and does not depend on a variable input voltage. An example of a clock boosting circuit would be one that generates an output that swings from ground when low to $2*V_{DD}$ when high.

The techniques described herein can be used in high-speed, low-voltage analog-to-digital converters. For example, ADCs with fast turn off times as described herein can be used in wireless infrastructure devices such as radio access network (RAN) devices, base station components, etc., to improve their performance.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplates examples in which only those elements shown or described are provided. Moreover, the present inventors also contemplates examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A circuit to improve turn-off time, comprising:
   a switch coupled to an input node for receiving an input voltage and to an output node and having a control terminal;
   a generator circuit coupled to the control terminal to control turning on the switch during a boosting phase; and
   a turn-off circuit coupled to the control terminal to control turning off the switch, the turn-off circuit including a protection device controlled by the input voltage during the boosting phase.

2. The circuit of claim 1, wherein the protection device is controlled by a constant voltage during a non-boosting phase.

3. The circuit of claim 1, wherein the turn-off circuit further comprises another switch coupled to the protection device and a reference potential.

4. The circuit of claim 3, wherein the another switch couples the switch to the reference potential during a non-boosting phase.

5. The circuit of claim 1, wherein the control terminal includes a gate terminal of the switch, and wherein the generator circuit and protection device are coupled to the gate terminal of the switch.

6. The circuit of claim 1, wherein a power supply voltage is provided to the generator circuit and is a positive voltage.

7. The circuit of claim 1, wherein a power supply voltage is provided to the generator circuit and is a non-positive voltage.

8. The circuit of claim 1, wherein the input voltage is a variable voltage.

9. The circuit of claim 1, wherein the control terminal is actuated to a fixed voltage beyond supply voltages during the boosting phase.

10. The circuit of claim 1, wherein the control terminal is actuated to the input voltage plus a fixed voltage during the boosting phase.

11. A method, comprising:
    receiving an input signal;
    during a boosting phase, boosting the input signal to generate a boosted control signal applied to a switch, wherein the switch is coupled to a turn-off circuit including a protection device; and
    controlling the protection device by the input signal during the boosting phase.

12. The method of claim 11, further comprising:
    controlling the protection device by a power supply voltage during a non-boosting phase.

13. The method of claim 12, wherein the power supply voltage is a positive voltage.

14. The method of claim 12, wherein the power supply voltage is a non-positive voltage.

15. The method of claim 11, further comprising:

coupling the switch to ground during the non-boosting phase via the protection device and another switch.

16. The method of claim 11, wherein the protection device is coupled to a gate terminal of the switch.

17. The method of claim 11, wherein the input signal is a variable voltage.

18. The method of claim 11, wherein the input signal is a fixed voltage.

19. A circuit, comprising:
a switch including:
an input terminal to receive an input voltage, an output terminal to connect to an output voltage, and a control terminal to control operation of the switch;
a generator circuit to generate a control signal to turn on the switch during the boosting phase; and
a turn-off circuit coupled to the control terminal, the turn-off circuit including a protection device controlled by the input voltage during the boosting phase.

20. The bootstrapping circuit of claim 19, wherein the protection device is controlled by a constant voltage during a non-boosting phase.

\* \* \* \* \*